United States Patent [19]

Wiedmann

[11] Patent Number: 4,535,425

[45] Date of Patent: Aug. 13, 1985

[54] HIGHLY INTEGRATED, HIGH-SPEED MEMORY WITH BIPOLAR TRANSISTORS

[75] Inventor: Siegfried K. Wiedmann, Stuttgart, Fed. Rep. of Germany

[73] Assignee: International Business Machines Corporation, Armonk, N.Y.

[21] Appl. No.: 375,896

[22] Filed: May 7, 1982

[30] Foreign Application Priority Data

May 30, 1981 [EP] European Pat. Off. ............ 81104145

[51] Int. Cl.³ .................. H01L 27/04; H03K 19/091; G11C 11/40
[52] U.S. Cl. ..................................... 365/156; 357/35; 357/92; 365/155; 365/179; 365/181
[58] Field of Search .................... 357/92, 35; 365/155, 365/156, 179, 181

[56] References Cited

U.S. PATENT DOCUMENTS

| | | | |
|---|---|---|---|
| 3,815,106 | 6/1974 | Wiedmann | 357/92 |
| 3,986,178 | 10/1976 | McElroy et al. | 357/92 |
| 4,144,586 | 3/1979 | U | 365/156 |
| 4,375,645 | 3/1983 | Funatsu | 357/92 |
| 4,412,239 | 10/1983 | Iwasaki et al. | 357/59 |

FOREIGN PATENT DOCUMENTS 1569800 3/1977 United Kingdom .

Primary Examiner—William D. Larkins
Assistant Examiner—Charles S. Small, Jr.
Attorney, Agent, or Firm—T. Rao Coca

[57] ABSTRACT

A memory is described comprising static MTL memory cells for high operation speeds. The cell or primary injectors and the bit line injectors are coupled to each other by an angular injection coupling via the low-resistivity base region of the cell flip-flop transistors. This results in a signal path with reduced series resistance and thus higher signals and a faster read operation obtainable. The density is additionally increased by using in common the primary injectors and the bit line injectors of adjacent cells of the array.

8 Claims, 11 Drawing Figures

HIGHLY INTEGRATED, HIGH-SPEED MEMORY WITH BIPOLAR TRANSISTORS

FIELD OF THE INVENTION

The invention generally relates to a highly integrated semiconductor memory with bipolar transistor cells. More particularly, the invention relates to an integrated memory arrangement with MTL (Merged Transistor Logic) cells which, due to an improved injection coupling course, provide superior read operation characteristics.

BACKGROUND OF THE INVENTION

Highly integrated memories with bipolar transistors are known in principle. U.S. Pat. No. 3,815,106, issued June 4, 1974 and assigned to the assignee of the present invention, for instance, describes a monolithic bipolar integrated memory cell, which consists of two cross-coupled flip-flop transistors, two collector load elements, one associated address line connected to the emitters, and one associated bit line pair. The base of each flip-flop transistor is connected to the emitter of an associated complementary address transistor whose collector is linked with the associated bit line and whose base is connected to an address line. The semiconductor structure of a memory cell of this type comprises a first zone of a first conductivity type which forms the emitters of the flip-flop transistors and the bases of the address transistors. A second zone of a second conductivity type is arranged within the first zone and forms the base of one flip-flop transistor as well as the emitter of the associated address transistor. A third zone of the second conductivity type is arranged within the first zone and forms the base of the other flip-flop transistor as well as the emitter of the associated address transistor. A fourth zone of the first conductivity type is arranged within the second zone and forms the collector of one flip-flop transistor. A fifth zone of the first conductivity type is arranged within the third zone and forms the collector of the other flip-flop transistor. Finally, sixth and seventh zones of the second conductivity type are arranged within the first zone and form the respective collector of the address transistors.

In the above MTL memory cell coupling of the read and the switching signals to the bit lines is effected by injection. During reading, part of the injector current is fed across the base region of the NPN transistor to the bit lines and the gate transistors, respectively, whose collector current form the read signal. As a result of this known type of injection coupling, it is possible to produce semiconductor structures permitting a very high packing density of the memory cells in an array. However, the disadvantage of such memory cell structures is that because of the relatively high series resistance of the NPN base region they permit only a relatively low read current. The relatively low read current in turn essentially limits the read speed.

Further, British Pat. No. 1569800 issued Aug. 20, 1980 describes a highly integrated logic circuit with a zone sequence forming an inverting transistor which by an injection region close to the base-emitter junction is supplied with operating current by charge carrier injection and which is controlled at the base. Connected to the injection region is a sense circuit by means of which the conductivity state of the inverting transistor is determined as a function of the current injected back into the injection region when this particular transistor is ON. The inverting transistor is formed by an inversely operated vertical transistor structure with a semiconductor layer arranged on a semiconductor material and forming the emitter zone. This semiconductor layer also comprises the base zone with a collector zone formed therein. Laterally to the base zone, the injection region of the same conductivity type is arranged which is simultaneously used as an emitter for the power supply and as a collector of a lateral transistor for sensing the conductivity state of the inverting transistor.

In the latter case, the bit line injector region is combined with the primary injector, so that the current does not have to flow through the high-resistivity NPN base region. The disadvantage of this circuit is that there is only a very low signal $\Delta V$ obtainable between the two line injectors, so that the read speed in connection with a memory or a programmable logic array is adversely affected, i.e., it becomes too low.

SUMMARY OF THE INVENTION

It is a primary object of the invention to provide a novel bipolar memory having a high storage density, a low power dissipation and a high speed of operation.

Another object is to provide a novel bipolar integrated memory with MTL cells wherein the structure of the cells permits the injection coupling characteristics to be very flexibly adapted to the electrical and physical requirements of the cells.

A further object is to provide a novel MTL cell wherein by varying the base widths and the injector lengths the cell properties can be favorably adapted to the respective process, circuit and layout parameters.

Still another object is to provide an improved integrated memory with MTL cells wherein the injection coupling is adapted to achieve higher read signals and a faster read operation, respectively.

According to the invention an improved memory with static MTL cells is described wherein the cell injectors (primary injectors) and the bit line injectors are coupled by an angular injection path via the low-resistivity base region of the respective conducting cell flip-flop transistor. This results in a signal path with a significantly reduced series resistance allowing for higher signals and a faster read operation to be obtainable.

The angular charge carrier flow between the laterally arranged doping regions leads to a structure that permits the injection coupling characteristics to be very flexibly adapted to the particular electrical and physical requirements of the memory cell. In contrast to previous MTL memory cells, the memory cell in accordance with the invention can be elegantly adapted to the respective process, circuit and layout parameters by varying the base widths and injector lengths. Parasitic couplings can be rendered ineffective in a known manner by means of suitable inhibitors, such as suitable doping and/or (oxide) isolation stripes.

The angular, and including as a special case orthogonal injection, coupling structure permits above all a signal path of relatively low resistance and thus the generation of high secondary injection currents and high read signals. Further, in contrast to known MTL cells, the read voltage does not decrease with lower current gain factors of the PNP transistors so that cell currents of almost any magnitude can be applied for reading. The favorable course of the current flow area permits the memory cell to be produced by a process which provides for top collector butting by dielectric isolation. A further essential advantage is that different addressing systems can be used during the operation of the memory cell in the array. This permits optimum adaptation to external conditions, such as memory size, capacity, speed, process characteristics, and memory cell density.

These and other objects and advantages of the present invention will become more apparent from the following detailed description taken in conjunction with the drawings.

BRIEF DESCRIPTION OF THE DRAWINGS

FIG. 2A—A and 2B—B show sectional views of the semiconductor structure of FIG. 2 taken along lines A—A and B—B in FIG. 2.

FIG. 3B—B shows a sectional view taken on line B—B of FIG. 3A.

FIG. 3D—D shows a sectional view taken on line D—D of FIG. 3C.

DETAILED DESCRIPTION OF THE INVENTION

Figure 1:
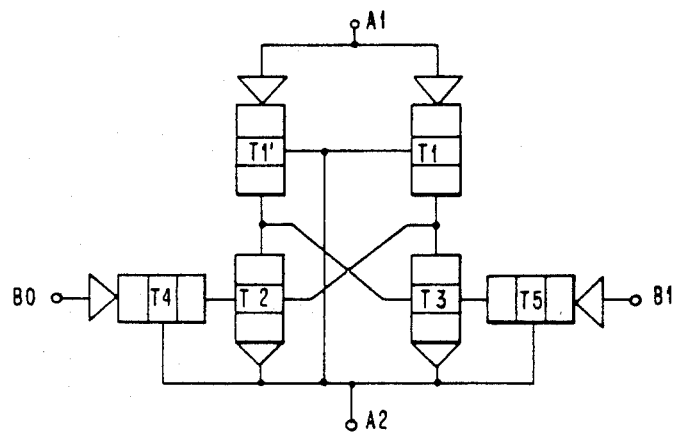
FIG. 1 shows a circuit diagram of a bipolar memory cell which is particularly suitable for implementation of the invention.
Figure 1:
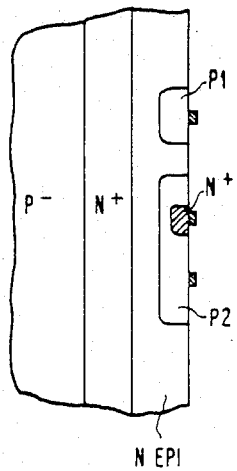

FIG. 1 is a circuit diagram of a memory cell consisting of bipolar transistors, which is particularly suitable for angular injection coupling. This memory cell according to FIG. 1 comprises cross-coupled flip-flop transistors T2 and T3 whose emitters are jointly connected to addressing node A2. The bases of the two bit line transistors T4 and T5, which are connected to the bit lines B0/B1 and the cross-coupled flip-flop transistors T2 and T3, respectively, are also connected to addressing node A2. This memory cell also comprises load transistors T1 and T1' whose bases are also jointly connected to addressing node A2. In addition, the emitters of the transistors T1 and T1' are connected to an addressing node A1 for addressing and selecting the cell in a cell array.

Figure 2:
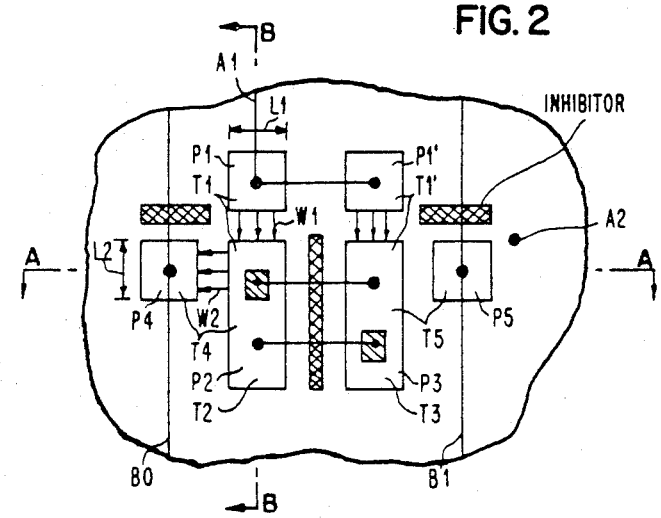
FIG. 2 shows a plan view of a memory cell layout with orthogonal injection coupling according to the invention.
Figure 2:
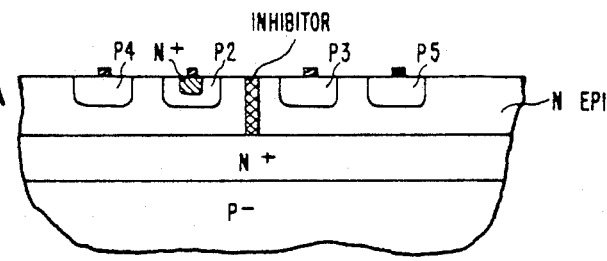

A memory cell structure with angular injection coupling according to the invention, is shown in FIG. 2. Before describing this figure in detail, it is noted that transistors T1, T1', T2, T3, T4 and T5 forming the memory cell according to FIG. 1 are shown in FIG. 2 in a highly integrated form and as such are designated with the same reference numbers. From FIG. 2 two bit lines B0 and B1 as well as the two addressing nodes A1 and A2 become apparent. The orthogonal course of the injection currents, as a special case of angular injection, is indicated in FIG. 2 by the arrows pointing from the primary injector regions P1, P1' to the flip-flop transistor base regions P2, P3 and from P2 to the bit line injector region P4.

As apparent from the sectional views of FIGS. 2A—A and 2B—B, the memory cells are arranged in a semiconductor layer sequence (viewed from bottom to top: P-substrate, N+ subcollector and N epitaxial layer). PNP transistors T1 and T1' are formed by regions P1 and P1', respectively, in the N epitaxial layer and by a further P region in the N epitaxial layer, namely, P2 and P3, respectively. The NPN flip-flop transistors T2 and T3 are also formed by the regions P2 and P3 in the N epitaxial layer with a further N+ region being arranged respectively in the P2 and the P3 region. PNP transistor T4 connected to the bit line B0 is formed by the P4 region in the N epitaxial layer and the adjacent P2 region. Likewise PNP transistor T5 of the memory cell depicted in FIG. 1 and connected to the bit line B1 is formed by the region P5 embedded in the N epitaxial layer and the adjacent P3 region. The two regions P1 and P1' are electrically connected and jointly linked with the node A1 by a further line, as is schematically represented in FIG. 2. To avoid parasitic couplings, the inhibitors, marked by crossed lines, are arranged in the semiconductor structure.

As may be seen from FIG. 2, one such structure is characterized by an orthogonal charge carrier flow between the lateral P regions. By means of the P regions P1, P1' referred to as primary injectors, the cell current is injected into the base regions P2, P3 of the inverted NPN flip-flop transistor structures T2 and T3. Part of this current is injected by the respective "ON" transistor into the adjacent P region of the bit line injectors P4 and P5. As a result of this measure, the state of the memory cell can be sensed very elegantly. This orthogonal injection coupling permits above all a current flow path with a relatively low series resistance and thus the generation of high secondary injection currents as well as high read signals. The read voltage difference does not decline as a result of diminished current gain factors of the PNP transistors, so that cell currents of a wide magnitude range may be used for an increased read operation speed. The favorable course of the current flow area permits the memory cell to be produced by a process which provides for top collector butting by dielectric isolation.

In addition, a memory cell structure as in FIG. 2 allows the injection coupling characteristics to be very flexibly adapted to the electrical and physical requirements of the particular memory cell. In contrast to known MTL memory cells, it is possible by separately varying the base widths W1 and W2 as well as the injector lengths L1 and L2 to most favorably adapt the memory cell of FIG. 2 to the respective process, circuit and layout parameters including tolerances.

For the operation of a memory cell according to FIG. 2 in a memory array different addressing systems can be used, the optimum scheme depending upon external conditions, such as memory size, memory density, capacity, speed, process characteristics, etc. Several very favorable addressing systems for a memory cell of the type as in FIG. 1 will be described herein below with reference to FIGS. 4A to 4C. This flexibility is of great advantage in VLSI (very large scale integrated) memory arrays, since a structure resulting from the injection course as proposed by the invention permits the corresponding physical layout to be optimized to a much higher extent than heretofore.

For reading, the memory cell in accordance with FIG. 2 is activated by increasing the potential of the primary injectors P1 and P1', arranged between addressing nodes A1 and A2, over the potential of the other non- or half-selected memory cells in the array.

The resultant bit line current is then sensed in a conventional sense amplifier (not shown) connected between B0 and B1.

During writing, the cell current of the selected memory cell in the array is switched off, and an appropriate write current is instead applied by the respective bit line injector P4 or P5, forcing the cell to assume a particular memory state.

The addressing node A2 can be arranged as a (doped) address line (N pocket) or as a metal line, contacting the N pocket or the N regions, and runs preferably perpendicularly to the bit lines B0 and B1 for impressing the write current, by means of X-Y selection, only into the bit line injector of the selected memory cell. The addressing node A1, in the form of a metallic line, may extend either parallel or perpendicularly to the address line A2. Both cases are associated with somewhat different capacitive selection currents resulting from different discharge currents of cell capacities of the half- or non-selected memory cells. This provides the designer with additional freedom to compromise between the complexity of the peripheral circuits, the speed and the performance of the memory.

Figure 3A:
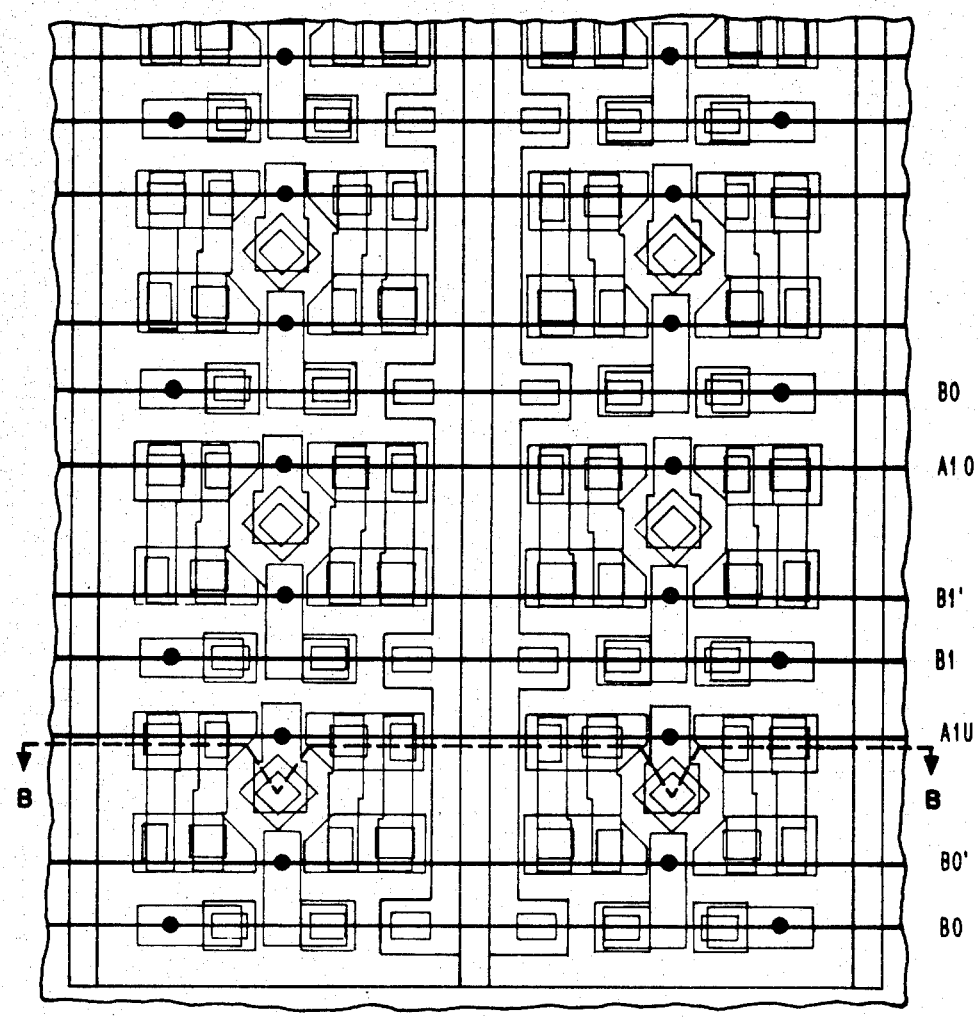
FIG. 3A shows a plan view of the physical structure of a memory section with several cells according to the invention.
Figure 3A:
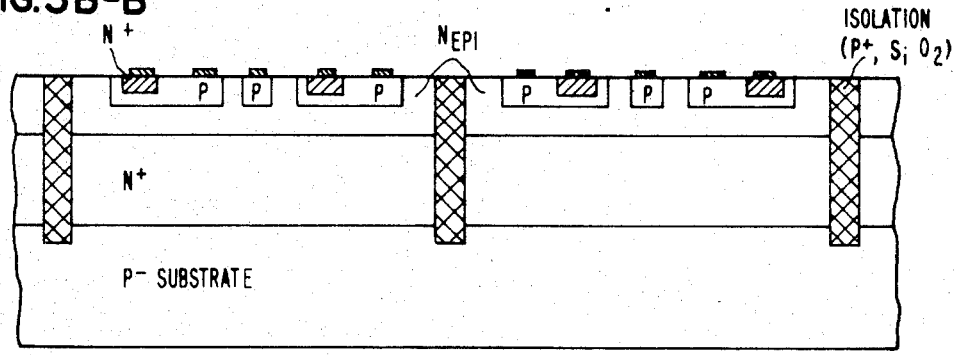

FIG. 3A is a plan view of part of a memory matrix consisting of memory cells in accordance with FIG. 1 and using angular injection coupling according to the invention. In this particular case the integration density is even higher than that of the structure of FIG. 2.

FIG. 3B—B shows a sectional view taken along line B—B of FIG. 3A. As may be seen from FIG. 3A, two bit lines B0 and B0' and B1 and B1' are arranged as line pairs running perpendicularly to the N epitaxial layer stripes which are separated by isolation stripes extending into the P substrate. In addition, the addressing node A1, in the form of a line A1 U arranged parallel to the bit lines, is positioned between the bit line pairs B0, B0' and B1, B1'. This arrangement of the bit lines B0, B0', etc. is obtained by combining two cells for the purpose of an even higher integration density than that of the structure in FIG. 2. Thus, the primary injectors P1, P1' of FIG. 2 are common to two storage cells, as may be seen in particular from FIGS. 3A and 3B—B.

Figure 3C:
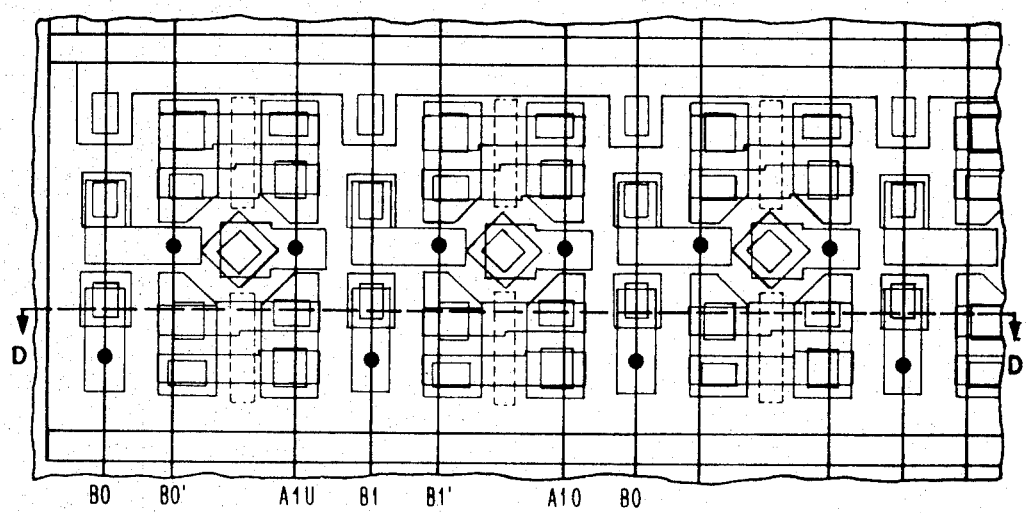
FIG. 3C shows in a plan view part of the memory layout of FIG. 3A.
Figure 3C:
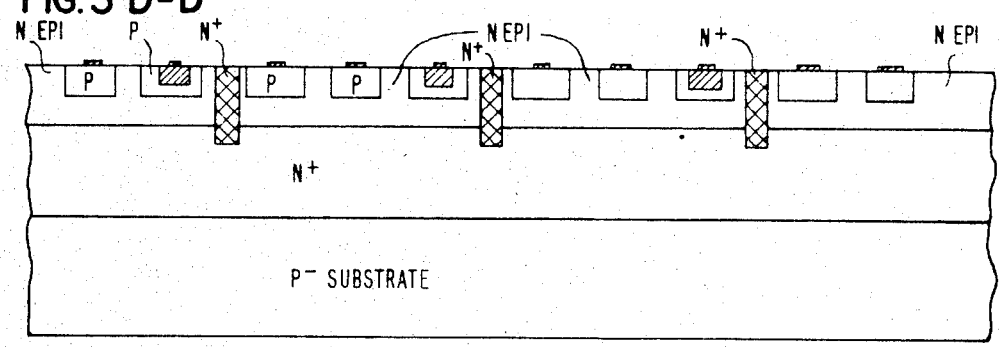

FIG. 3C is a further plan view of part of the layout illustrated in FIG. 3A to show more clearly the sectional view of FIG. 3D—D taken along line D—D of FIG. 3C. This sectional view also shows the arrangement of isolators (inhibitors) of N+ material which prevent the primary injectors and other P regions from being detrimentally coupled. As may be seen from the drawings, two adjacent memory cells in this particular layout have common bit line injectors. For a known process, it was shown as possible to achieve an up to 30 percent higher density at a much higher read speed.

Figure 4A:
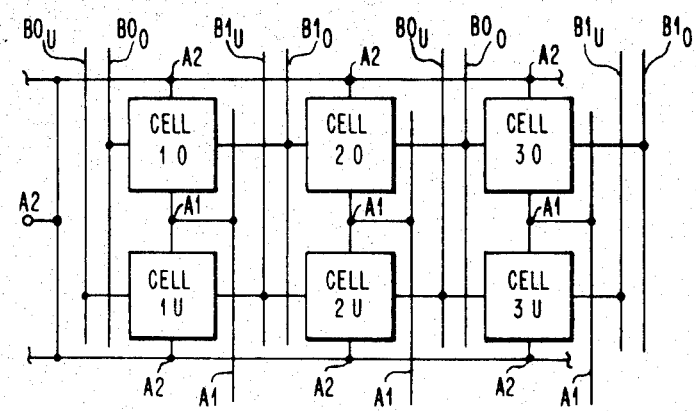
FIGS. 4A to 4C show schematical representations of favorable addressing schemes for the cells in a memory array according to the invention.
Figure 4B:
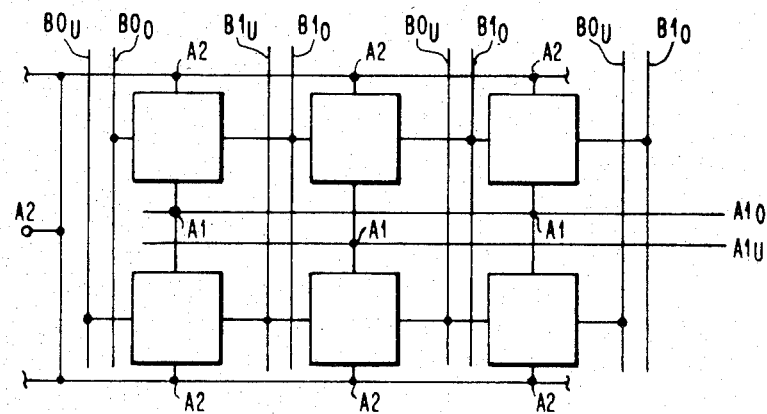
Figure 4C:
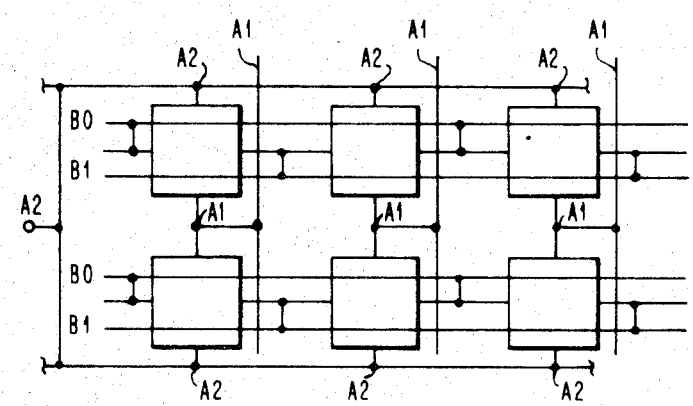

To summarize, the structures in accordance with FIGS. 2 and 3 lead to a considerable increase in density over previously known storage cells as well as to a very high read signal both with respect to current and voltage. FIGS. 4A to 4C, described briefly below, show favorable selection schemes for memory cells in an array. All figures show two rows of storage cells, namely 1 0 to 3 0 and 1 U to 3 U. The cells of the upper and the lower row 1 0 to 3 0 and 1 U to 3 U are jointly connected to the one addressing node A2, whereas the cells in the array arranged below each other, 1 0, 1 U and 2 0, 2 U, etc , are jointly connected to the other addressing node A1. In addition, there are separate bit lines provided for the cells in the upper and lower row; these bit lines are designated as B0 U and B0 0 or B1 U and B1 0, respectively.

FIG. 4B shows a further example of a selection scheme which differs from that shown in FIG. 4A only by addressing nodes A1 for the memory cells of the upper and the lower row being each connected to a separate line A1 0 and A1 U, respectively.

FIG. 4C illustrates a further modification of the selection scheme of FIG. 4A, wherein the cell connection to the addressing nodes A1 and A2 is the same but the design and connection of the bit lines B1 and B0 differs. In this case the bit line pairs B0/ B1 extend parallel to each other, the memory cells and the bit lines being interconnected by a further line positioned between the memory cells. As a result of this measure, there is only one line that extends perpendicularly to all the other lines.

While the invention has been particularly shown and described with reference to the preferred embodiments thereof, it will be understood by those skilled in the art that various changes in form and detail may be made therein without departing from the spirit and scope of the invention.

What is claimed is:

1. A memory with MTL memory cells each comprising:
    a first address line;
    a pair of integrated transistor structures connected as switching transistors of a flip-flop circuit, each transistor structure comprising:
    a first semiconductor region of one conductivity type and constituting the emitter connected to said address line;
    a second semiconductor region of the opposite conductivity type and within said first region and constituting the base; and
    a third semiconductor region of said one conductivity type and within said second region and constituting the collector;
    a primary injector provided in common for at least two adjacent memory cells, said injector being formed by at least one fourth semiconductor region of said opposite conductivity type provided adjacent said second semiconductor region and adapted to feed an injection current into said second semiconductor region in a first direction;
    a pair of bit lines; and
    a pair of bit line injectors provided in common for at least two adjacent memory cells, said pair of bit line injectors being formed by a fifth and sixth semiconductor region of said opposite conductivity type and each being provided adjacent one of said second semiconductor regions and adapted to collect part of said injection current via said second semiconductor region in a second direction different from said first direction;
    whereby through an angular injection course via the base region of the respective conductive switching transistor of said pair of switching transistors the memory cell is provided with a low series resistance signal path from the primary injector to the respective bit line injector.

2. The memory of claim 1 wherein the bit lines are metal lines and the first address line is arranged perpendicularly to the bit lines and adapted to impress a write pulse by means of X-Y selection into a bit line injector of the selected memory cells.

3. The memory of claim 2 further comprising a second address line connected to the primary injectors and being arranged parallel to the first address line.

4. The memory of claim 2 further comprising a second address line connected to the primary injectors and being arranged perpendicular to the first address line.

5. The memory of claims 3 or 4 wherein said second address line is a metal line.

6. The memory of claims 3 or 4 wherein said second address line consists of polycrystalline silicon material.

7. The memory of claims 3 or 4 further comprising:
means for selectively increasing the voltage at the primary injector(s) between the first and second address lines over the voltage applied to non- or half-selected memory cells, and
a sense amplifier connected to the bit lines and adapted to determine the resulting bit line current.

8. The memory of claims 3 or 4 further comprising:
means for selectively interrupting the current flow into the primary injector of a selected memory cell; and
means for applying a suitable write current via the respective bit line injector to force the respective memory cell to assume a particular memory state.

* * * * *